(12) United States Patent
Sasaki et al.

(10) Patent No.: US 10,096,652 B2
(45) Date of Patent: Oct. 9, 2018

(54) SEMICONDUCTOR MEMORY DEVICE

(71) Applicant: TOSHIBA MEMORY CORPORATION, Minato-ku, Tokyo (JP)

(72) Inventors: Takahiko Sasaki, Tokyo (JP); Takeshi Yamaguchi, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/465,034

(22) Filed: Mar. 21, 2017

(65) Prior Publication Data

US 2018/0076264 A1  Mar. 15, 2018

Related U.S. Application Data

(60) Provisional application No. 62/393,171, filed on Sep. 12, 2016.

(51) Int. Cl.
  *H01L 29/49*  (2006.01)
  *H01L 27/24*  (2006.01)
  *H01L 45/00*  (2006.01)
  *G11C 13/00*  (2006.01)

(52) U.S. Cl.
  CPC ...... *H01L 27/2436* (2013.01); *H01L 45/1233* (2013.01); *G11C 13/0026* (2013.01); *G11C 13/0028* (2013.01)

(58) Field of Classification Search
  CPC .................. H01L 27/2436; H01L 45/1233
  See application file for complete search history.

(56) References Cited

U.S. PATENT DOCUMENTS

| | | | |
|---|---|---|---|
| 8,248,836 B2 | 8/2012 | Jin et al. | |
| 8,547,720 B2 | 10/2013 | Samachisa et al. | |
| 9,281,345 B2 | 3/2016 | Kanno et al. | |
| 9,508,430 B2 | 11/2016 | Murooka | |
| 9,514,792 B2 | 12/2016 | Kajigaya | |
| 2010/0219392 A1* | 9/2010 | Awaya | H01L 27/0688 257/3 |
| 2013/0336037 A1 | 12/2013 | Chen et al. | |
| 2015/0014622 A1* | 1/2015 | Kanno | H01L 45/10 257/4 |
| 2015/0155333 A1 | 6/2015 | Kobayashi et al. | |
| 2017/0271586 A1* | 9/2017 | Tanaka | H01L 45/1233 |
| 2017/0345870 A1* | 11/2017 | Tseng | H01L 27/2436 |

FOREIGN PATENT DOCUMENTS

| | | |
|---|---|---|
| JP | 2013-065638 A | 4/2013 |
| JP | 2013-535101 A | 9/2013 |
| JP | 2015-019048 A | 1/2015 |
| JP | 2015-106708 A | 6/2015 |

* cited by examiner

*Primary Examiner* — Michael Shingleton
(74) *Attorney, Agent, or Firm* — Foley & Lardner LLP

(57) ABSTRACT

A semiconductor memory device according to an embodiment includes: a first wiring line extending in a first direction; a second wiring line extending in a second direction, the second direction intersecting the first direction; a variable resistance film disposed at an intersection of the first wiring line and the second wiring line; a channel body disposed at a first end of the first wiring line; a third wiring line electrically connected to the first wiring line via the channel body; and a gate wiring line extending in the first direction and facing the channel body from the second direction.

19 Claims, 20 Drawing Sheets

_US 10,096,652 B2_

SEMICONDUCTOR MEMORY DEVICE

CROSS-REFERENCE TO RELATED APPLICATION

This application is based upon and claims the benefit of priority from the prior U.S. Provisional Application 62/393,171, filed on Sep. 12, 2016, the entire contents of which are incorporated herein by reference.

BACKGROUND

Field

Embodiments of the present invention relate to a semiconductor memory device.

Description of the Related Art

A flash memory is a semiconductor memory device known for its low cost and large capacity. One example of a semiconductor memory device to replace the flash memory is a variable resistance type memory (ReRAM: Resistance RAM) which employs a variable resistance film in its memory cell. The ReRAM can configure a cross-point type memory cell array, hence can achieve a similar increase in capacity to the flash memory. Moreover, in order to further increase capacity, there is also being developed a ReRAM having a so-called VBL (Vertical Bit Line) structure in which bit lines which are selection wiring lines are arranged in a perpendicular direction to a semiconductor substrate.

DETAILED DESCRIPTION

A semiconductor memory device according to an embodiment includes: a first wiring line extending in a first direction; a second wiring line extending in a second direction, the second direction intersecting the first direction; a variable resistance film disposed at an intersection of the first wiring line and the second wiring line; a channel body disposed at a first end of the first wiring line; a third wiring line electrically connected to the first wiring line via the channel body; and a gate wiring line extending in the first direction and facing the channel body from the second direction.

Semiconductor memory devices according to embodiments will be described below with reference to the drawings.

First Embodiment

First, an overall configuration of a semiconductor memory device according to a first embodiment will be described.

Figure 1:
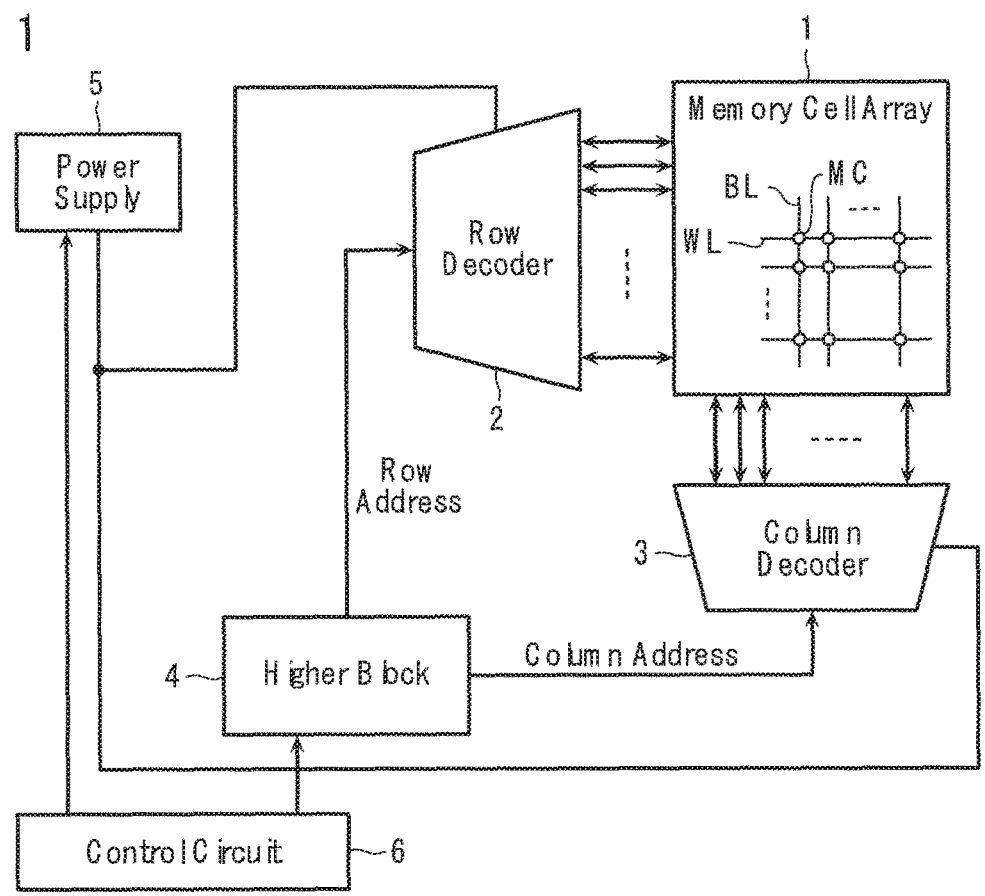
FIG. 1 is a view showing functional blocks of a semiconductor memory device according to a first embodiment.

FIG. 1 is a view showing functional blocks of the semiconductor memory device according to the present embodiment.

As shown in FIG. 1, the semiconductor memory device of the present embodiment comprises: a memory cell array 1; a row decoder 2; a column decoder 3; a higher block 4; a power supply 5; and a control circuit 6.

The memory cell array 1 includes: a plurality of bit lines BL; a plurality of word lines WL; and a plurality of memory cells MC selected by these bit lines BL and word lines WL. Note that the bit line BL is configured by a local bit line LBL and a global bit line GBL that will be described later. The control circuit 6 controls the higher block 4 and the power supply circuit 5 based on a command from external. At this time, the control circuit 6 transmits to the higher block 4 an address related to the memory cell MC that is to be an access target. The power supply 5, during an access operation, generates voltages required in this operation, and supplies the voltages to the row decoder 2 and the column decoder 3. The higher block 4, during the access operation, transmits a row address to the row decoder 2, transmits a column address to the column decoder 3, and selects the memory cell MC that is to be the access target. The row decoder 2, during the access operation, selects the word line WL based on the row address, and supplies this word line WL with the voltage required in the access operation. The column decoder 3, during the access operation, selects the bit line BL based on the column address, and supplies this bit line BL with the voltage required in the access operation.

Next, an example of a circuit of the memory cell array 1 of the present embodiment will be described.

Hereafter, the memory cell array 1 of this working example will be indicated by the symbol 100 in order to distinguish it from a memory cell array 1 of another working example and a comparative example.

Figure 2:
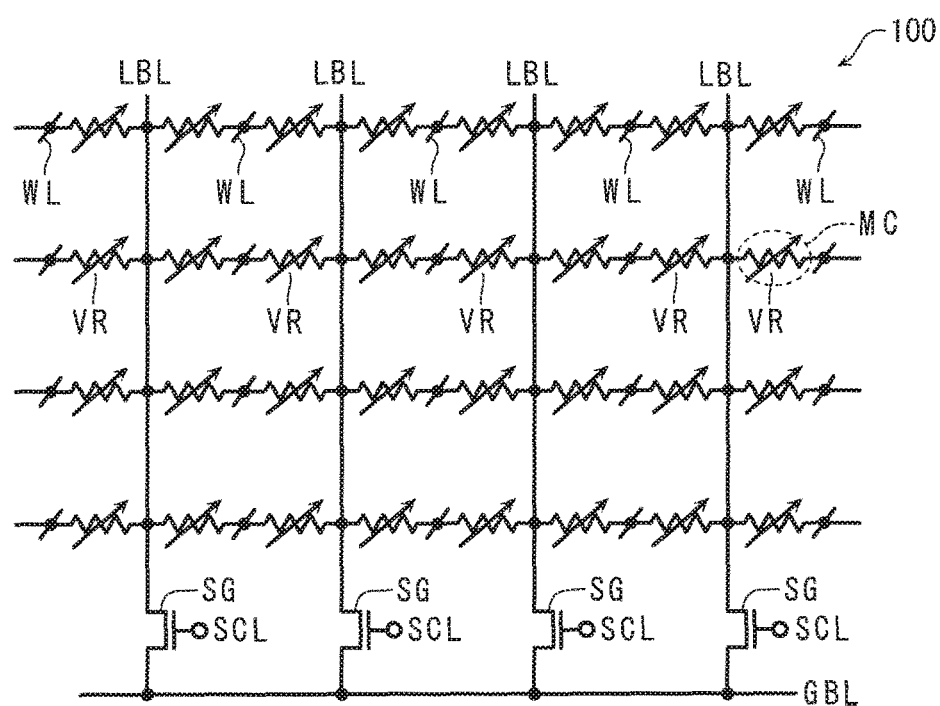
FIG. 2 is a circuit diagram of a memory cell array of the semiconductor memory device according to the same embodiment.

FIG. 2 is a circuit diagram of the memory cell array 100 of the semiconductor memory device according to the present embodiment.

As shown in FIG. 2, the memory cell array 100 includes a plurality of the memory cells MC disposed at intersections of a plurality of the local bit lines LBL and a plurality of the word lines WL. Each of the memory cells MC includes a variable resistance film VR whose two ends are electrically connected to a certain local bit line LBL and a certain word line WL. In addition, the memory cell array 100 includes the global bit line GBL. Several local bit lines LBL are commonly connected, each via a select gate SG, to one global bit line GBL. Each of the select gates SG is controlled by a select gate control line SCL (gate wiring line).

Next, a structure of the memory cell array 100 will be described.

Figure 3:
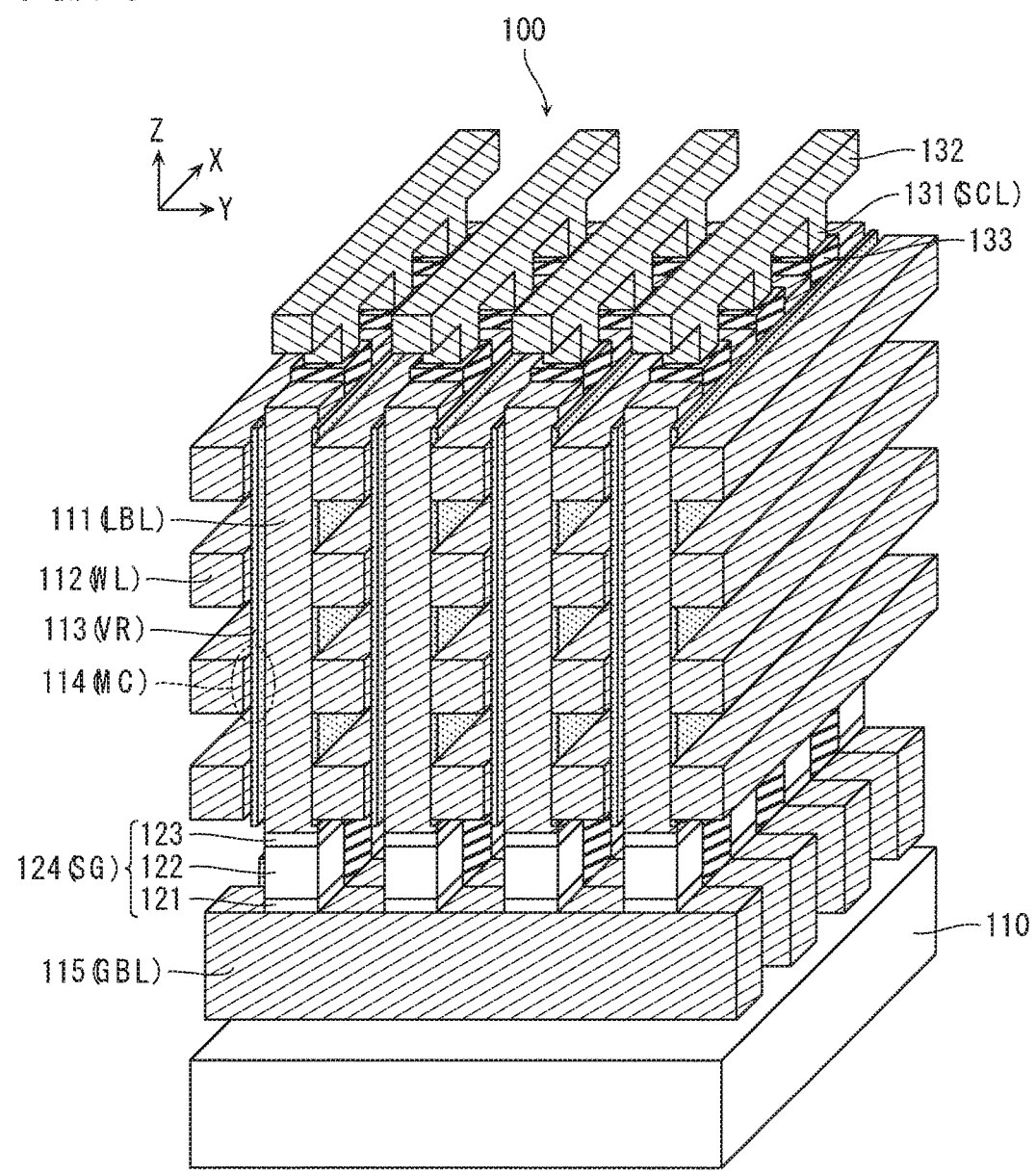
FIG. 3 is a perspective view of the memory cell array of the semiconductor memory device according to the same embodiment.
Figure 4:
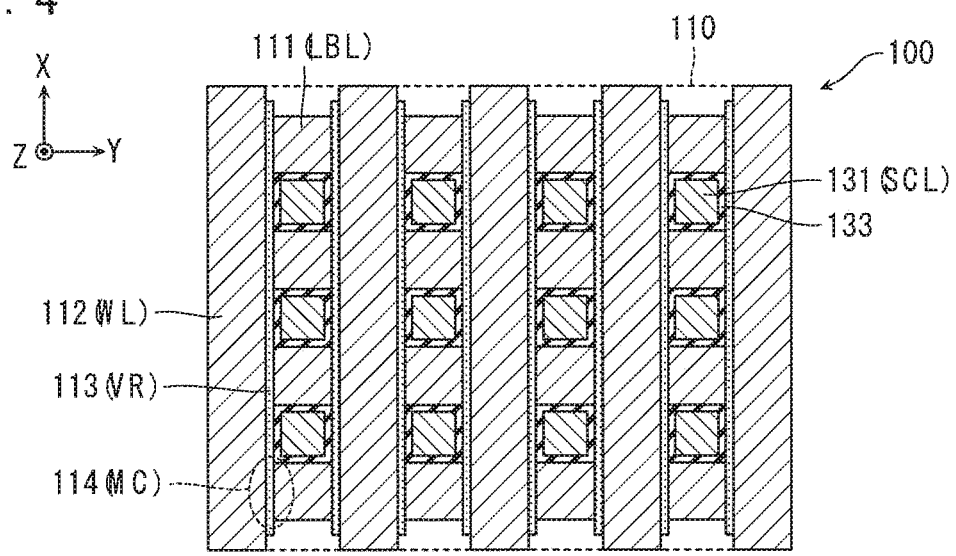
FIGS. 4 to 7 are cross-sectional views of the memory cell array of the semiconductor memory device according to the same embodiment.
Figure 5:
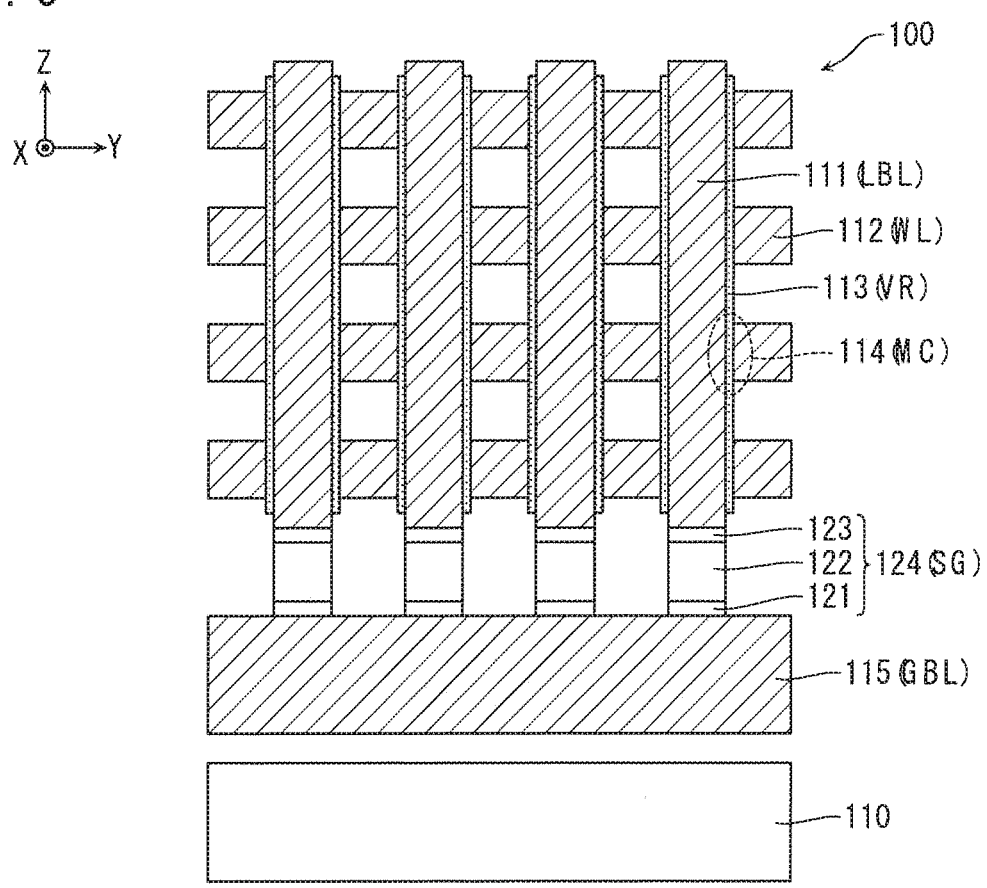
Figure 6:
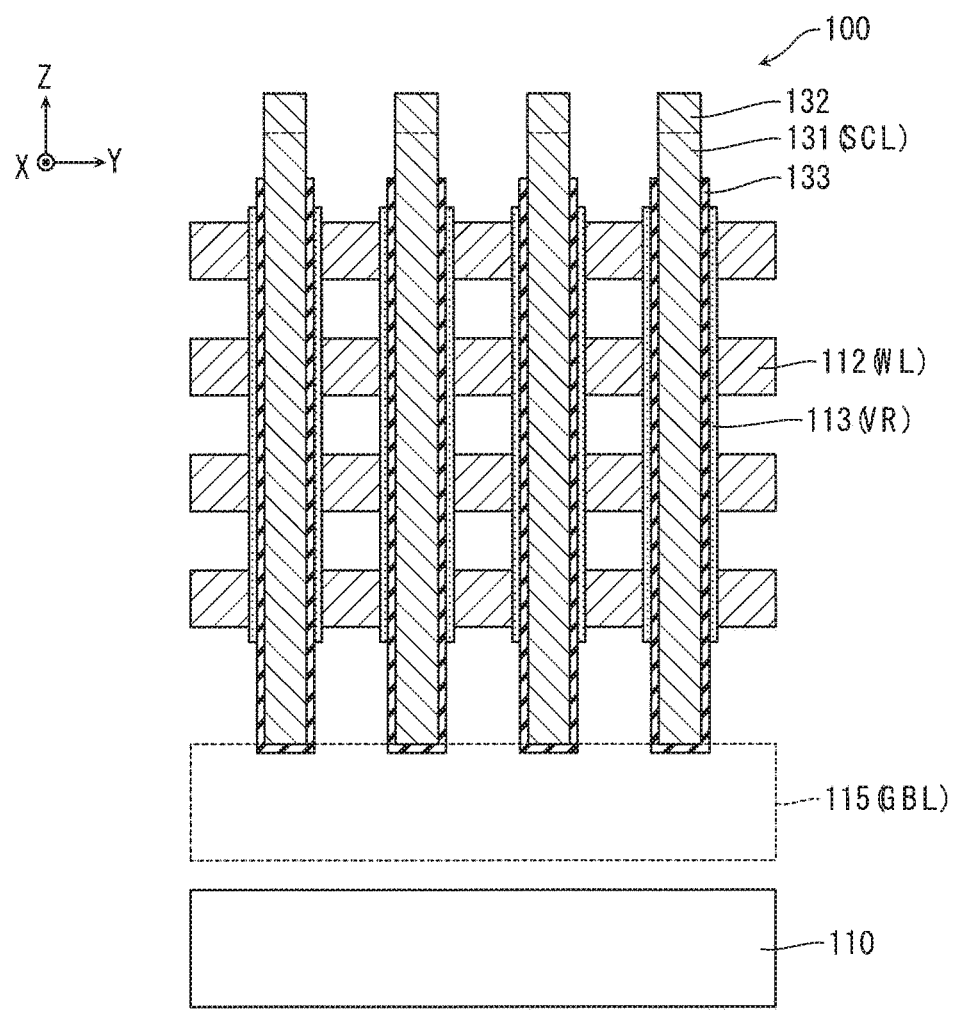
Figure 7:
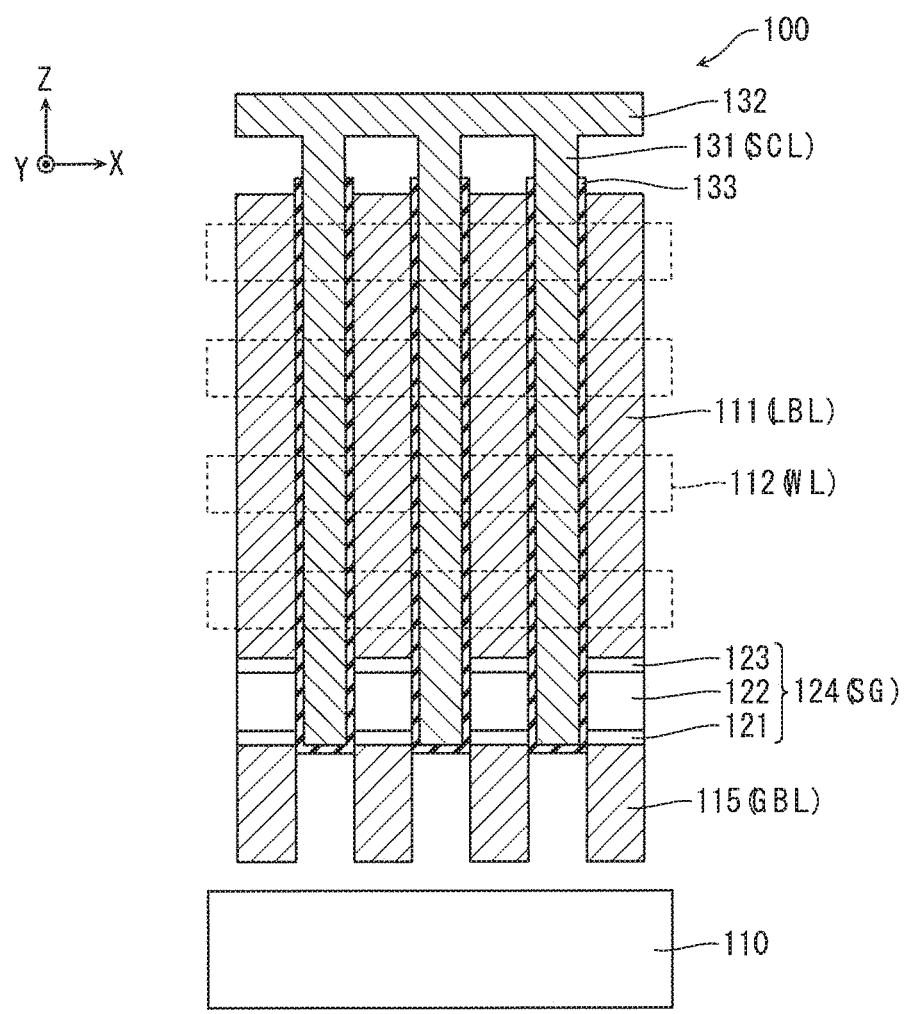

FIG. 3 is a perspective view of the memory cell array 100 of the semiconductor memory device according to the present embodiment; and FIGS. 4 to 7 are cross-sectional views of the memory cell array 100. In FIG. 3, for ease of understanding of the structure of the memory cell array 100, part of the configuration such as an insulating film is omitted. FIG. 4 is a cross-sectional view in X-Y directions at a position of the word line WL in a Z direction. FIG. 5 is a cross-sectional view in the Y-Z directions at a position of the local bit line LBL in the X direction. FIG. 6 is a cross-sectional view in the Y-Z directions at a position of the select gate control line SCL in the X direction. FIG. 7 is a cross-sectional view in the Z-X directions at a position of the select gate control line SCL in the Y direction.

The memory cell array 100 has a so-called VBL (Vertical Bit Line) structure in which a local bit line 111 (LBL) extends perpendicularly to a principal plane of a semiconductor substrate 110. In other words, a plurality of the local bit lines 111 are arranged in a matrix in the X direction and the Y direction, and each extend in the Z direction. A plurality of word lines 112 (WL) are arranged in a matrix in the Y direction and the Z direction, and each extend in the X direction. A variable resistance film 113 (VR) of each of memory cells 114 (MC) is disposed at each of intersections of the plurality of local bit lines 111 and the plurality of word lines 112. Note that in the case of the memory cell array 100, the variable resistance films 113 of a plurality of the memory cells 114 aligned in the X direction and the Z direction are formed integrally. However, the present embodiment is not limited to this structure, and the variable resistance films 113 may be separated every memory cell 114, for example. Now, the local bit line 111 is formed by, for example, doped polysilicon (doped Poly-Si), tungsten nitride (WN), or a stacked body of tungsten nitride (WN) and tungsten (W). The word line 112 is formed by titanium nitride (TiN), for example. The variable resistance film 113 is formed by a material whose resistance changes electrically. For example, the variable resistance film 113 is formed by hafnium oxide (HfO$_2$), tantalum oxide (TaO$_2$), titanium oxide (TiO$_2$), zirconium oxide (ZrO$_2$), aluminum oxide (Al$_2$O$_3$), silicon oxide (SiO$_2$), or a stacked body of those.

A plurality of global bit lines 115 (GBL) extending in the X direction and the Y direction are disposed between the semiconductor substrate 110 and the plurality of local bit lines 111. Moreover, a select gate 124 (SG) is disposed at each of lower ends of the plurality of local bit lines 111. The select gates 124 are each configured by a source/drain layer 121, a channel layer 122 (channel body), and a source/drain layer 123 that are stacked in the Z direction from the global bit line 115 to the local bit line ill. A plurality of the local bit lines 111 aligned in the Y direction are electrically commonly connected to one global bit line 115 via these select gates 124. Now, the global bit line 115 is formed by titanium nitride (TiN), for example. The source/drain layers 121 and 123 are formed by, for example, a donor being diffused in p type silicon (p-Si). The channel layer 122 is formed by p type silicon (p-Si), for example.

As previously mentioned, the select gate 124 is controlled by a select gate control line 131 (SCL). Each of the select gate control lines 131 of the present embodiment is at least disposed at a position of the local bit line 111 in the Y direction and a position of the channel layer 122 of the select gate 124 in the Z direction, between the local bit lines 111 adjacent in the X direction. In the case of the memory cell array 100, each of the select gate control lines 131 is formed in a column shape extending from a position of a lower end of the select gate 124 to a position of a select gate control connecting line 132 located more upwardly than an upper end of the local bit line 111, in the Z direction. Moreover, the select gate control lines 131 aligned in the X direction are commonly connected to the select gate control connecting line 132 disposed more upwardly than the uppermost layer word line 112 and extending in the X direction intersecting the global bit line 115. These select gate control lines 131 are driven from their upper ends, whereby each of the select gates 124 is controlled by the two select gate control lines 131 by which the respective select gates 124 are sandwiched in the X direction. Moreover, an insulating film 133 is disposed between each of the select gate control lines 131 and the local bit line 111. As a result, the select gate control line 131 is electrically insulated from the local bit line 111. Note that in the case of the memory cell array 100, the insulating film 133 is disposed so as to cover the four side surfaces and a bottom surface of the select gate control line 131. Now, the select gate control line 131 and the select gate control connecting line 132 are formed by doped polysilicon (doped Poly-Si), for example. Moreover, the insulating film 133 is formed by silicon oxide (SiO$_2$), for example.

Next, advantages of the memory cell array 100 of the present embodiment will be described using a memory cell array 700 of a comparative example.

Figure 23:
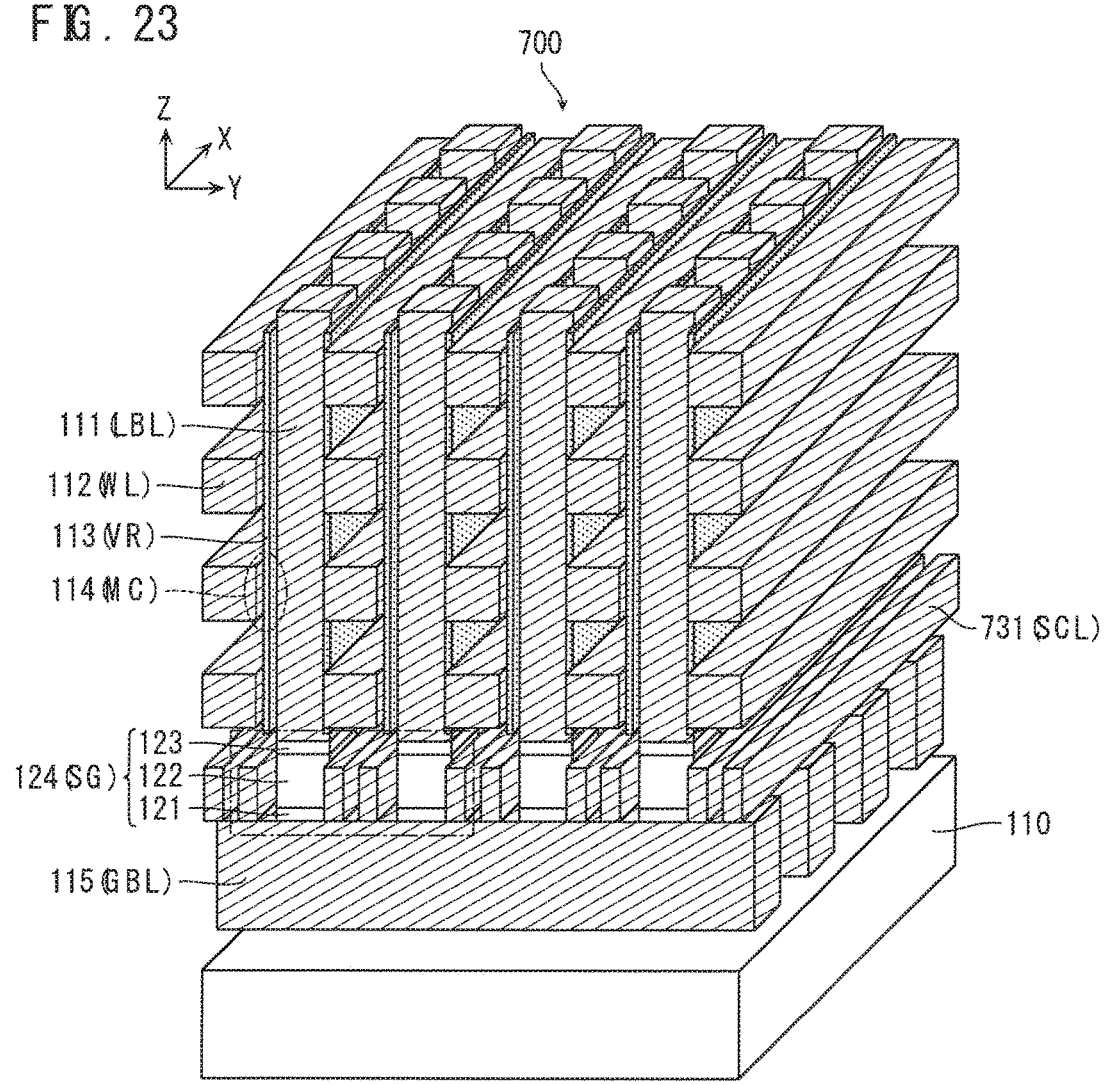
FIG. 23 is a perspective view of a memory cell array of a semiconductor memory device according to a comparative example.
Figure 24:
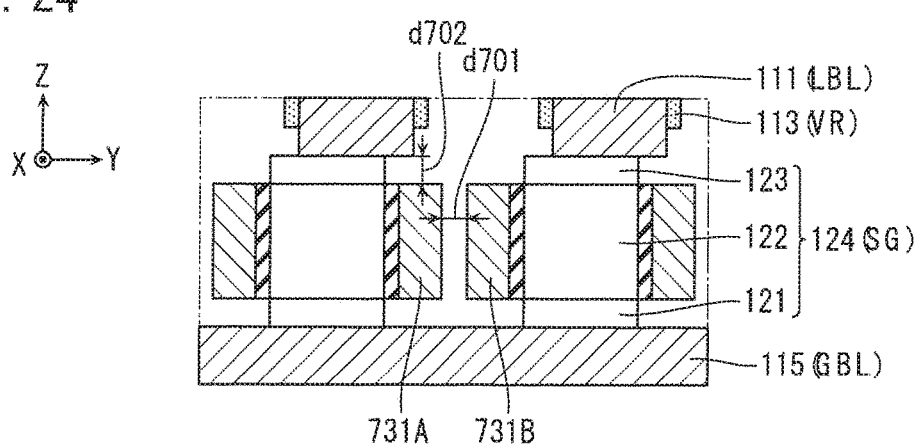
FIG. 24 is a cross-sectional view of the memory cell array of the semiconductor memory device according to the comparative example.

FIG. 23 is a perspective view of the memory cell array 700 of a semiconductor memory device according to the comparative example; and FIG. 24 is a cross-sectional view of a range surrounded by the dot-chain line shown in FIG. 23 of the memory cell array 700. In FIG. 23, for ease of understanding of the structure of the memory cell array 700, part of the configuration such as an insulating film is omitted. FIG. 24 is a cross-sectional view in the Y-Z directions at a position of the local bit line LBL in the X direction. Note that configurations similar to the configurations shown in FIGS. 3 to 7, of FIGS. 23 and 24 are assigned with the same symbols as in FIGS. 3 to 7, and descriptions of those configurations will be omitted.

In the memory cell array 700 of the comparative example, a structure of a select gate control line 731 (SCL) differs from in the memory cell array 100. Specifically, the select gate control line 731 is disposed at a position of the select gate 124 in the Z direction, between the local bit lines 111 adjacent in the Y direction. Two select gate control lines 731 separated in the Y direction and extending in the X direction are disposed in each space between the local bit lines 111 adjacent in the Y direction, such that two select gates 124 adjacent in the Y direction can be independently controlled.

In the case of the memory cell array 700 having this structure, the following problems occur. In other words, if a spacing of two of the local bit lines 111 adjacent in the Y direction is determined based on a processing pitch of the word lines 112, then, as shown in FIG. 24, when this processing pitch is narrow, a spacing d701 in the Y direction of select gate control lines 731A and 731B adjacent in the Y direction becomes even narrower, and it becomes easier for the two to short circuit. Conversely, when the spacing d701 is broadened to avoid this short circuiting, the processing pitch of the word lines 112 further broadens, and, as a result, a cell occupancy rate of the chip ends up being lowered.

Furthermore, as shown in FIG. 24, when a misalignment of the local bit line 731 and the select gate 124 occurs in the Y direction, a spacing d702 of a bottom surface of the local bit line 111 protruding from an upper surface of the select gate 124 and the select gate control line 731 narrows, and a withstand voltage between the two ends up lowering. Conversely, when a height in the Z direction of the select gate control line 731 is lowered to avoid this withstand voltage drop, deterioration of performance or variation in performance of the select gate 124 ends up occurring.

In that respect, in the case of the memory cell array 100, as previously mentioned, the select gate control line 131 is disposed between the local bit lines 111 adjacent in the X direction. Therefore, occurrence of short circuiting between the select gate control lines 131 adjacent in the Y direction is extremely reduced compared to in the memory cell array 700. As a result, narrowing of pitch of the word lines 112 becomes possible, and consequently, improvement of cell occupancy rate becomes possible.

Moreover, in the case of the structure of the memory cell array 100, the local bit line 111 and the select gate 124 can be batch processed. Therefore, occurrence of misalignment of the local bit line 111 and the select gate 124 can be extremely reduced compared to in the memory cell array 700. As a result, occurrence of deterioration in withstand voltage between the local bit line 111 and the select gate control line 131 or variation in performance of the select gate 124 caused by this misalignment, can be reduced.

Furthermore, in the case of the memory cell array 100, a region between the local bit lines 111 aligned in the X direction where a wiring line or the like is not disposed in the memory cell array 700, can be utilized in disposition of the select gate control line 131, hence there is little effect on another structure excluding the select gate control line SCL. Moreover, it is sufficient that the select gates 124 adjacent in the X direction can be batch controlled, hence there is no need for two select gate control lines 131 to be disposed with a narrow pitch in each space between the select gates 124 adjacent in the X direction. Therefore, the problem of short circuiting between the select gate control lines 131 in the X direction does not occur either.

From the above, the memory cell array 100 of the present embodiment makes it possible to provide a semiconductor memory device that, while reducing occurrence of short circuiting between the select gate control lines or variation in performance of the select gate, achieves improvement in cell occupancy rate or reduction of chip area.

Next, other working examples of the memory cell array 1 of the present embodiment will be described.

Figure 8:
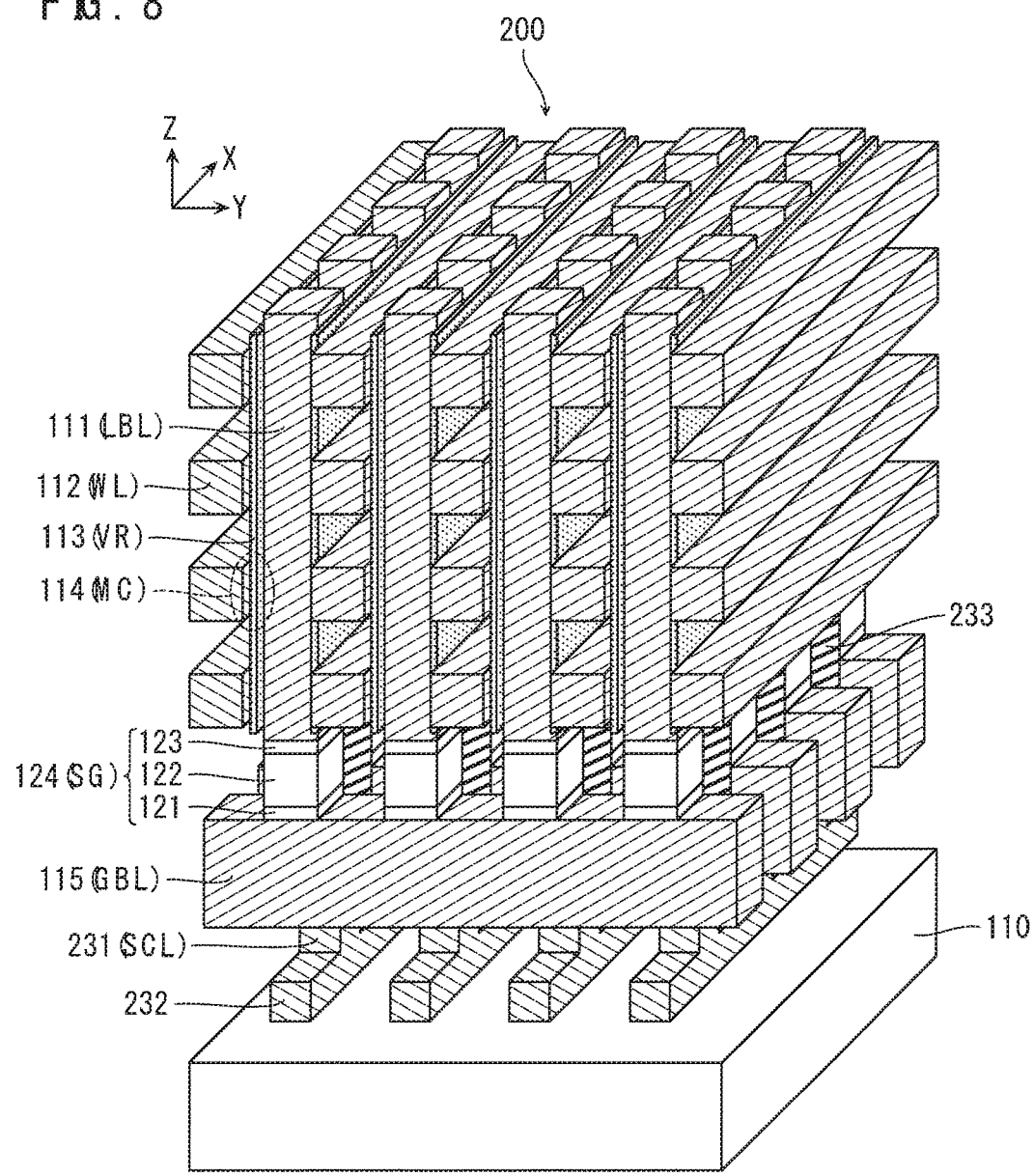
FIG. 8 is a perspective view of the memory cell array of the semiconductor memory device according to the same embodiment.
Figure 9:
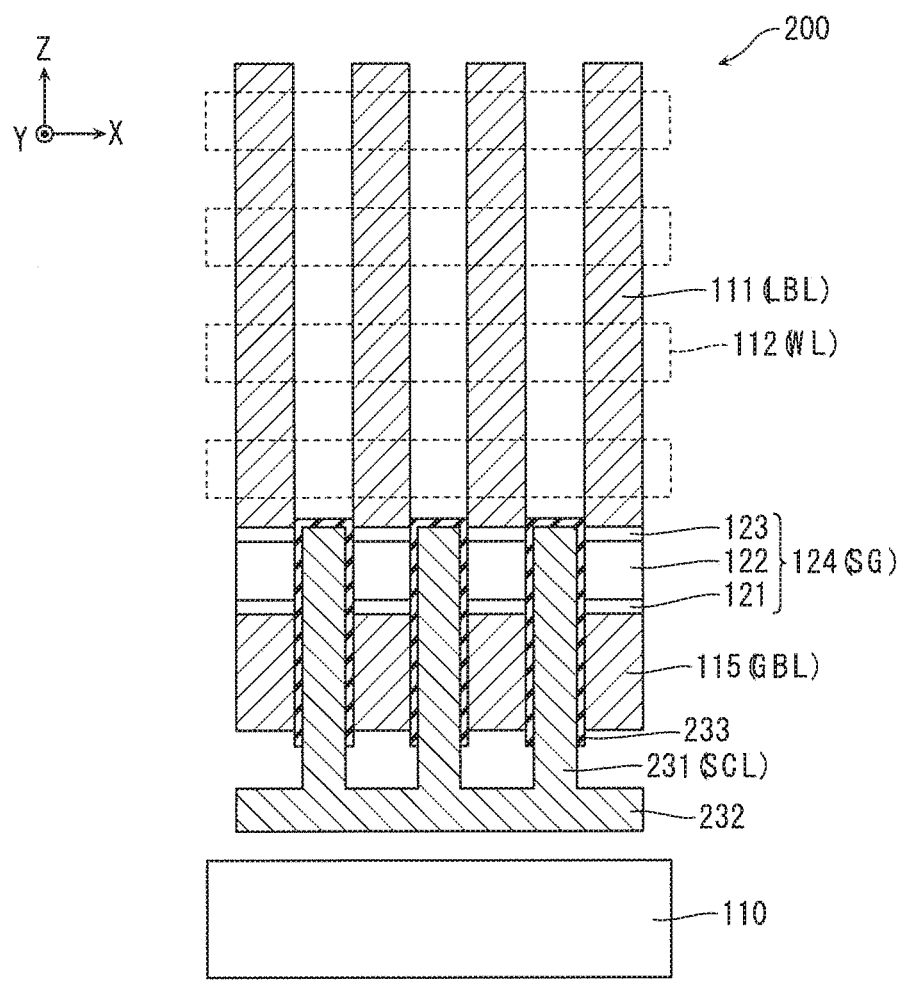
FIG. 9 is a cross view of the memory cell array of the semiconductor memory device according to the same embodiment.
Figure 10:
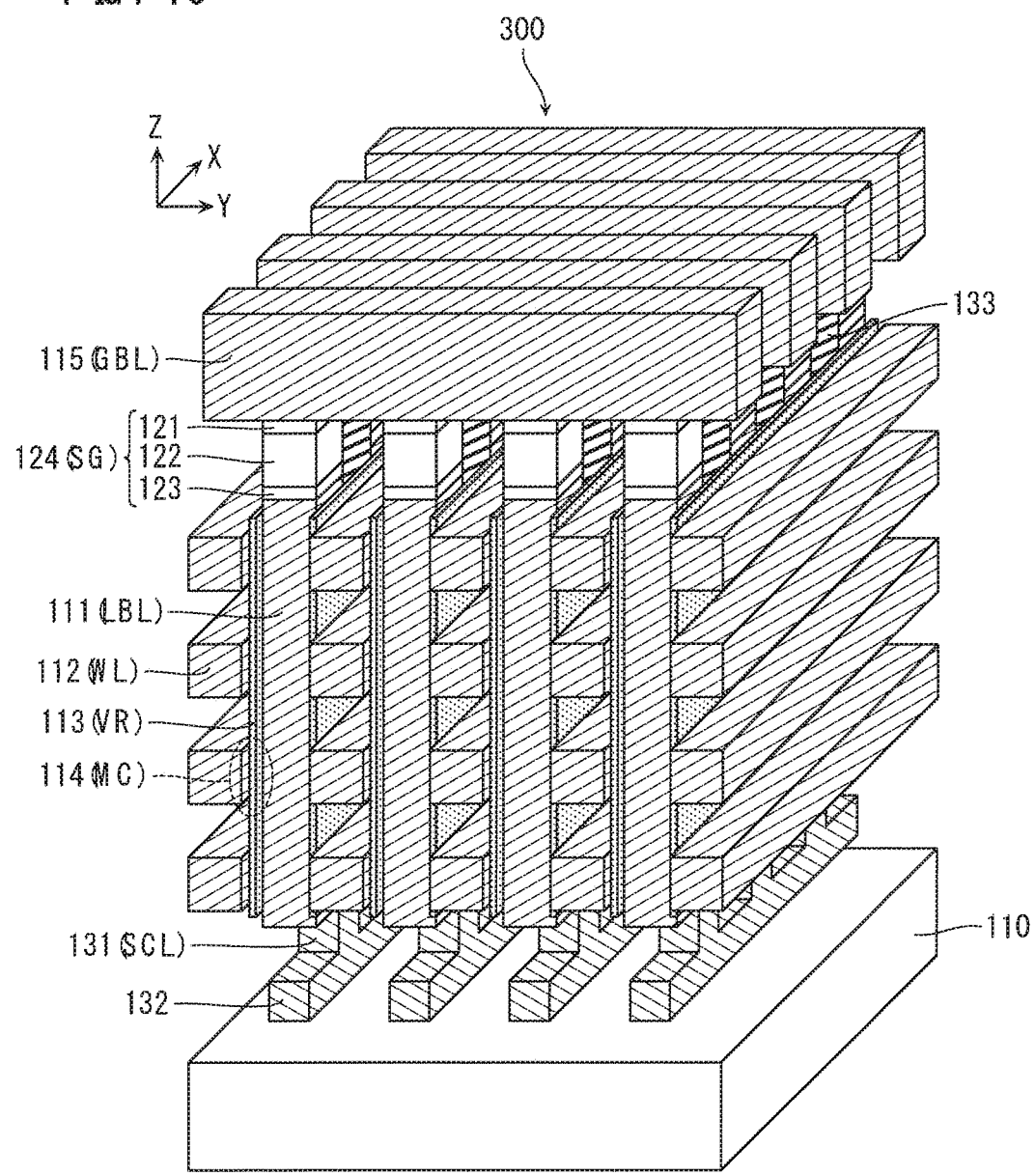
FIG. 10 is a perspective view of the memory cell array of the semiconductor memory device according to the same embodiment.
Figure 11:
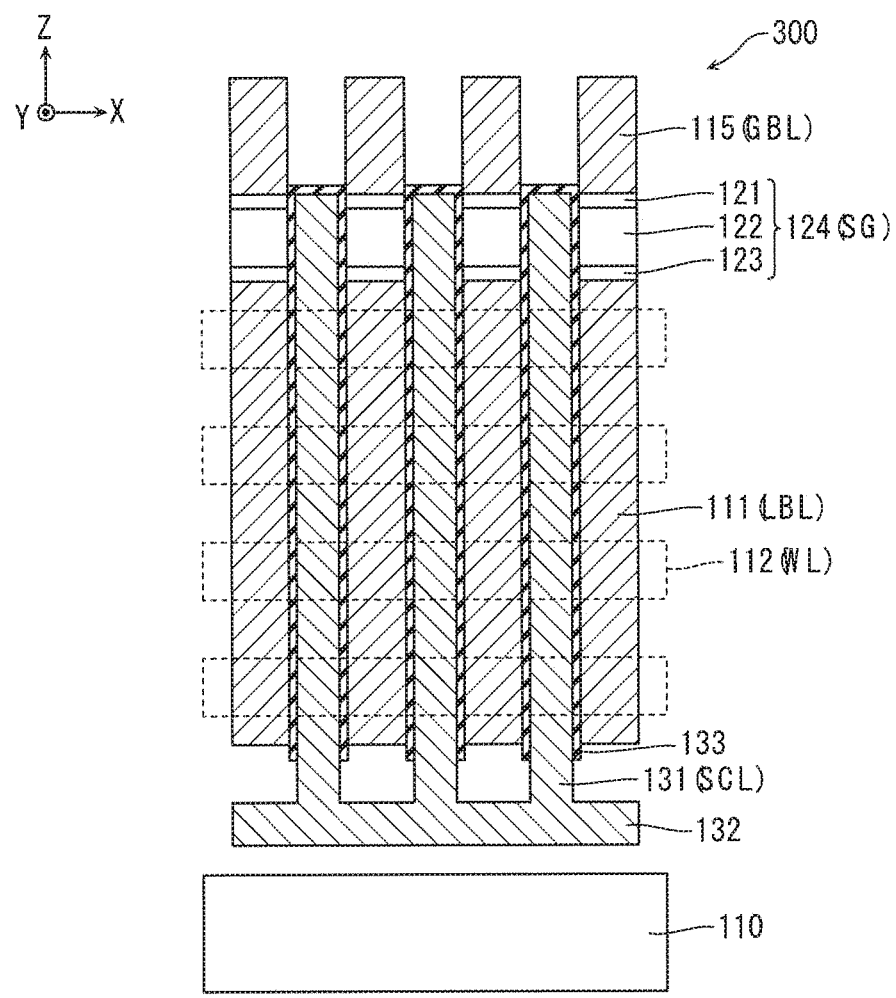
FIG. 11 is a cross-sectional view of the memory cell array of the semiconductor memory device according to the same embodiment.

FIGS. 8 and 10 are perspective views of memory cell arrays 200 and 300 of the semiconductor memory device according to the present embodiment; and FIGS. 9 and 11 are cross-sectional views of the memory cell arrays 200 and 300. In FIGS. 8 and 10, for ease of understanding of the structures of the memory cell arrays 200 and 300, part of the configuration such as an insulating film is omitted. FIGS. 9 and 11 are cross-sectional views in the Y-Z directions at a position of the local bit line 111 in the X direction. Note that configurations similar to the configurations shown in FIGS. 3 to 7, of FIGS. 8 to 11 are assigned with the same symbols as in FIGS. 3 to 7, and descriptions of those configurations will be omitted.

In the memory cell array 200 shown in FIGS. 8 and 9, structures of a select gate control line 231 (SCL) and a select gate control connecting line 232 differ from in the memory cell array 100. Specifically, the select gate control connecting line 232 is disposed between the semiconductor substrate 110 and the global bit line 115 in the Z direction. Moreover, the select gate control lines 231 aligned in the X direction are commonly connected at their lower ends to the select gate control connecting line 232, and each end up being driven from their lower sides. Note that in the case of the memory cell array 200, due to the above-described differences from the memory cell array 100, an insulating film 233 corresponding to the insulating film 133 is also formed so as to cover an upper surface, not a bottom surface, of each select gate control line 231.

The memory cell array 300 shown in FIGS. 10 and 11 has a structure of the memory cell array 100 configured upside down with respect to the semiconductor substrate 110. In other words, the global bit line 115 is disposed more upwardly than the uppermost layer word line 112, and is disposed further from the semiconductor substrate 110 than the word line 112 is. Moreover, the local bit line 111 and the global bit line 115 are electrically connected via the select gate 124 disposed on an upper end of the local bit line 111. Moreover, the select gate control connecting line 132 is disposed more downwardly than the lowermost layer word line 112, and the select gate control line 131 is connected at its lower end to the select gate control connecting line 132.

These memory cell arrays 200 and 300 are also able to achieve similar advantages to those of the memory cell array 100.

Second Embodiment

In a second embodiment, a semiconductor memory device in which the local bit line LBL of the memory cell array 1 is employed as an on/off controllable channel body, will be described. In the present embodiment, mainly points different from in the first embodiment will be described. First, a circuit of a memory cell array 400 which is an example of the memory cell array 1 of the present embodiment, will be described.

Figure 12:
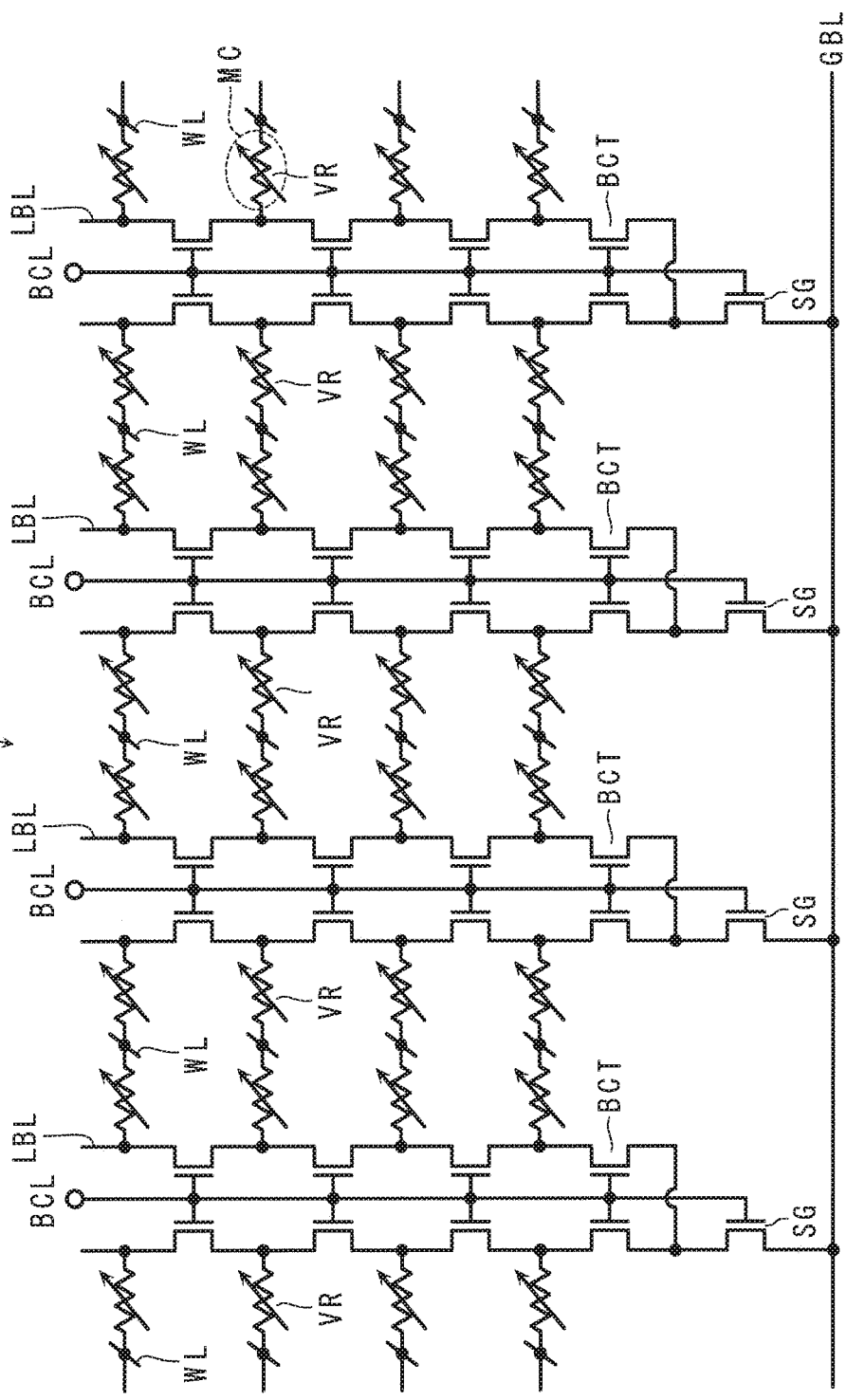
FIG. 12 is a circuit diagram of a memory cell array of a semiconductor memory device according to a second embodiment.

FIG. 12 is a circuit diagram of the memory cell array 400 of the semiconductor memory device according to the present embodiment.

In the memory cell array 400, contrary to in the memory cell array 100, the local bit line LBL is configured by a plurality of series-connected transistors, not simply a wiring line. Hereafter, these transistors will be referred to as "bit line control transistors BCT". All of the bit line control transistors BCT belonging to each local bit line LBL are batch controlled by a bit line control line BCL (gate wiring line). Moreover, in the case of the memory cell array 400, this bit line control line BCL batch controls also the select gate SG connected to a lower end of the corresponding local bit line LBL. Hereafter, control of all of the bit line control transistors BCT belonging to the local bit line LBL will sometimes also be expressed simply as "control of the local bit line LBL".

Next, a structure of the memory cell array 400 will be described.

Figure 13:
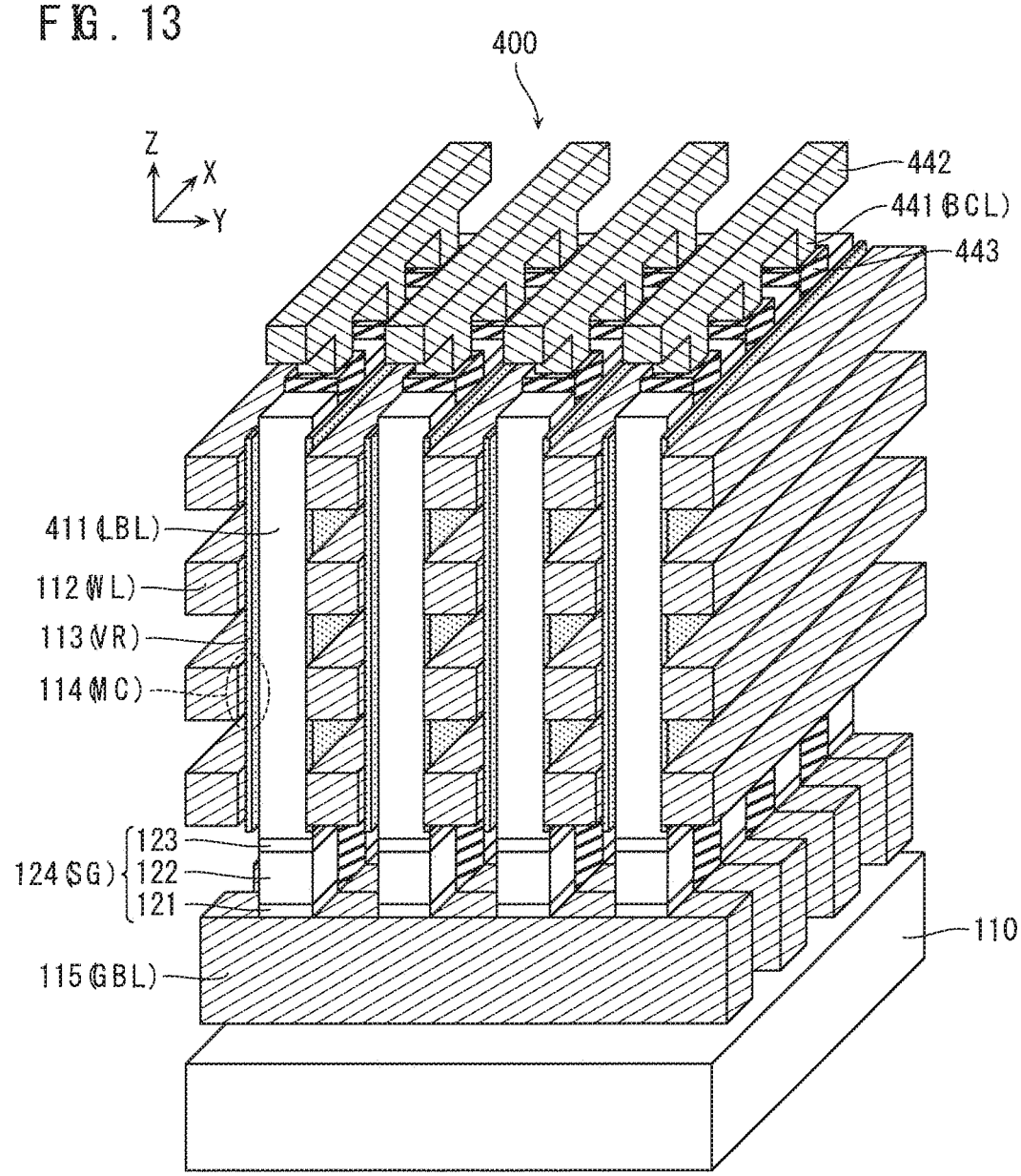
FIG. 13 is a perspective view of the memory cell array of the semiconductor memory device according to the same embodiment.
Figure 14:
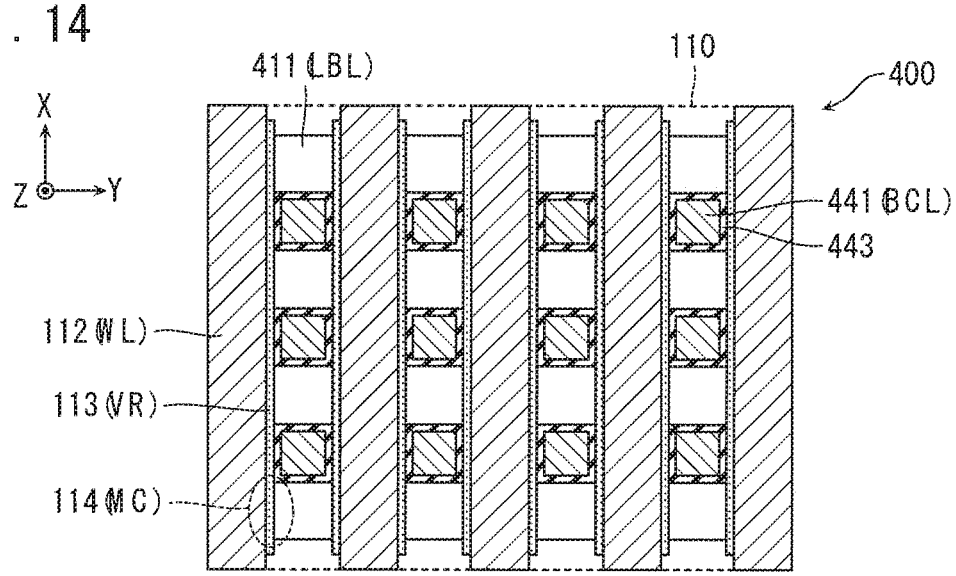
FIGS. 14 to 17 are cross-sectional views of the memory cell array of the semiconductor memory device according to the same embodiment.
Figure 15:
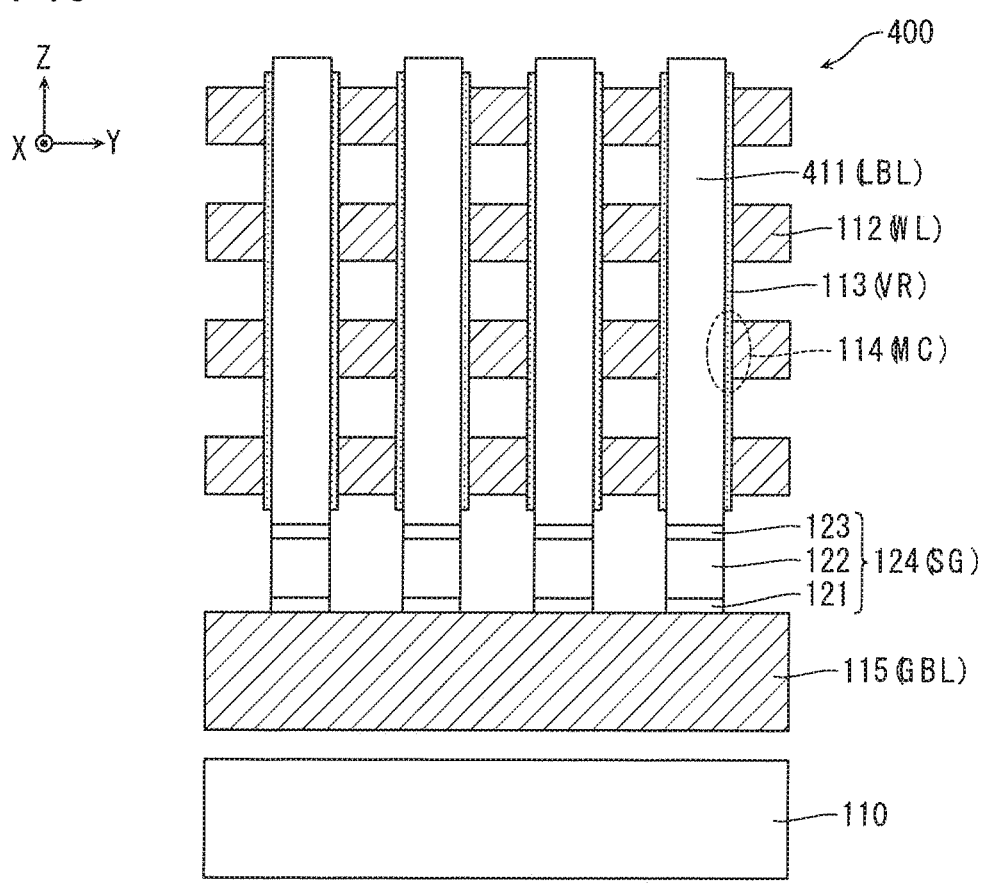
Figure 16:
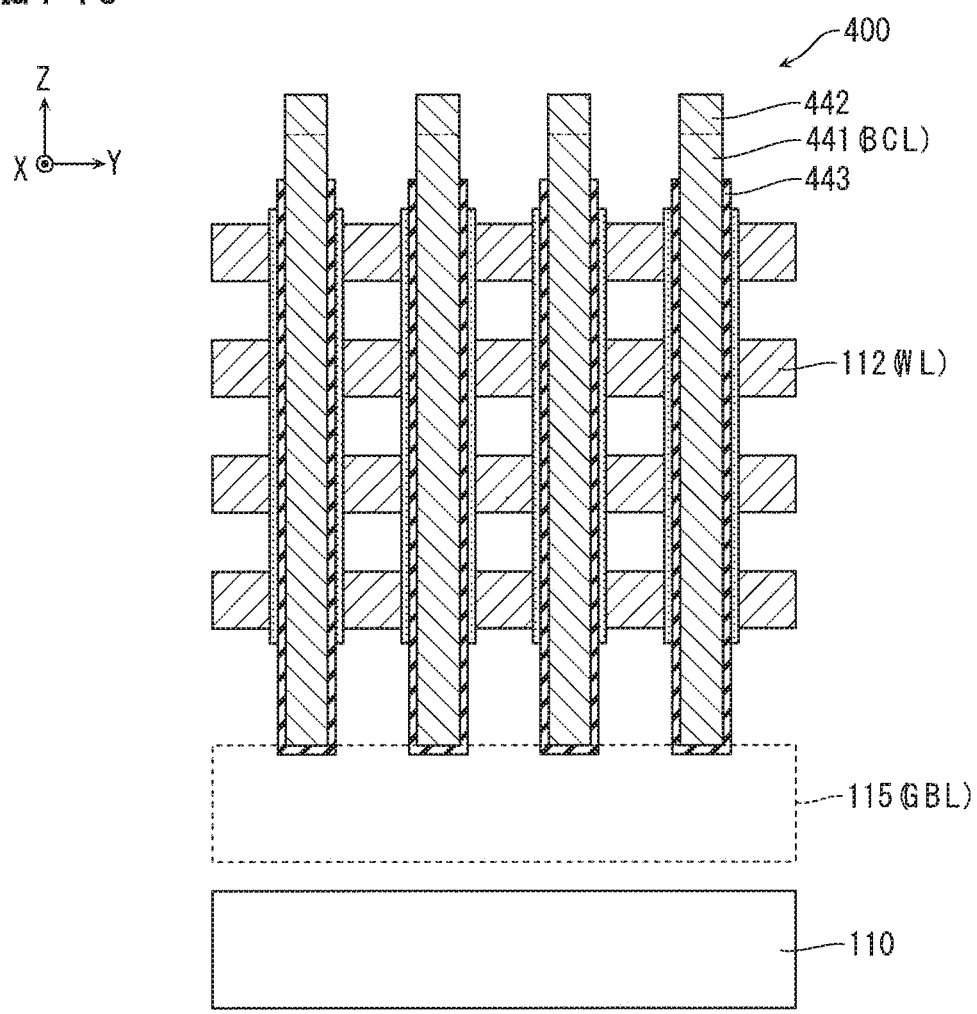
Figure 17:
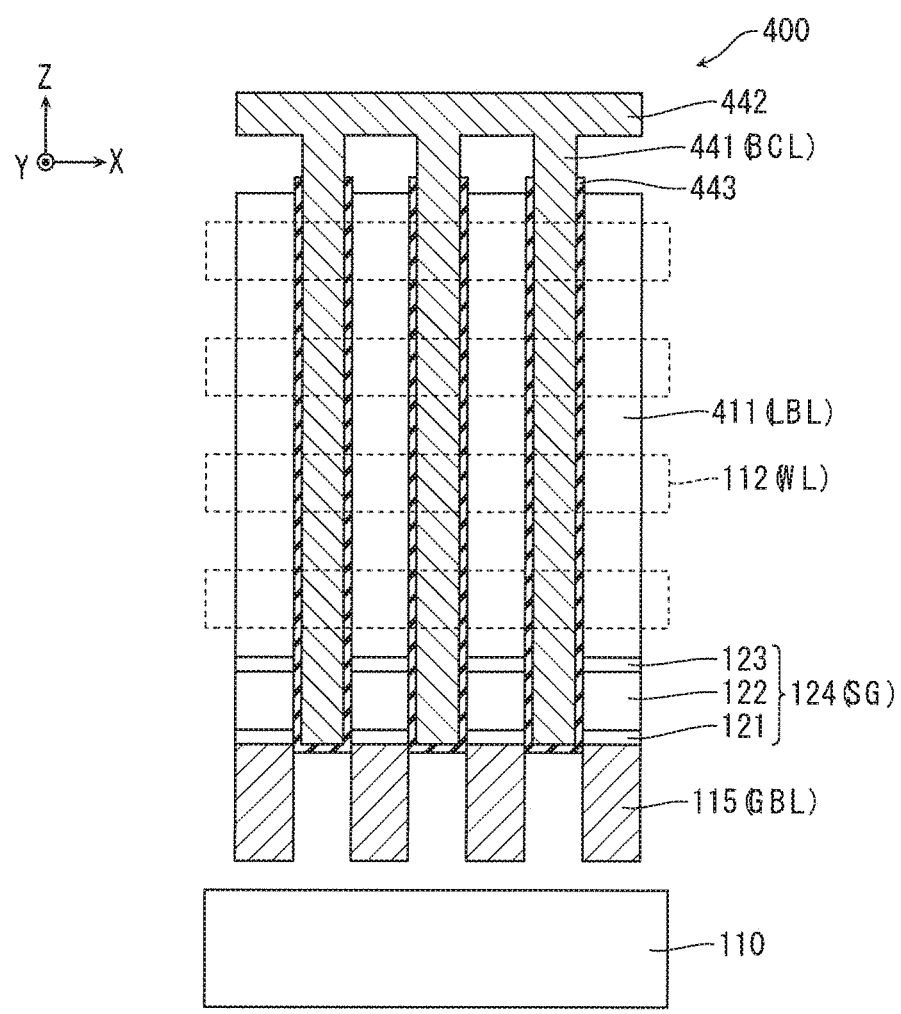

FIG. 13 is a perspective view of the memory cell array 400 of the semiconductor memory device according to the present embodiment; and FIGS. 14 to 17 are cross-sectional views of the memory cell array 400. In FIG. 13, for ease of understanding of the structure of the memory cell array 400, part of the configuration such as an insulating film is omitted. FIG. 14 is a cross-sectional view in the X-Y directions at a position of the word line WL in the Z direction. FIG. 15 is a cross-sectional view in the Y-Z directions at a position of the local bit line LBL in the X direction. FIG. 16 is a cross-sectional view in the Y-Z directions at a position of the bit line control line BCL in the X direction. FIG. 17 is a cross-sectional view in the Z-X directions at a position of the bit line control line BCL in the Y direction.

In the memory cell array 400, contrary to in the memory cell array 100, a local bit line 411 (LBL) is formed by a semiconductor material such as polysilicon (Poly-Si), for example, and functions as a channel body of a plurality of the bit line control transistors BCT. In addition, the memory cell array 400, instead of including the select gate control line 131 (SCL), the select gate control connecting line 132, and the insulating film 133 of the memory cell array 100, includes a bit line control line 441 (BCL), a bit line control connecting line 442, and an insulating film 443 that have a similar structure to and are similarly disposed to these. In other words, each of the bit line control lines 441 is formed in a column shape extending from a position of a lower end of the select gate 124 to a position of the bit line control connecting line 442 located more upwardly than an upper end of the local bit line 411, in the Z direction. Moreover, the bit line control lines 441 aligned in the X direction are commonly connected to the bit line control connecting line 442 disposed more upwardly than the uppermost layer word line 112 and extending in the X direction intersecting the global bit line 115. These bit line control lines 441 are driven from their upper ends, whereby each of the local bit lines 411 and select gates 124 respectively connected to their lower ends is batch controlled by the two bit line control lines 441 by which the respective local bit lines 411 and select gates 124 are sandwiched in the X direction. In other words, the bit line control lines 441 of the memory cell array 400 could be said to integrate gates of the local bit lines 411 and the select gates 124.

Next, advantages of the memory cell array 400 of the present embodiment will be described using a memory cell array of a comparative example.

The memory cell array of the comparative example, contrary to the memory cell array 400, is not provided with the select gate 124, and has a structure in which the local bit line 411 and the global bit line 115 are directly connected.

In the case of the memory cell array of the comparative example having this structure, the local bit line 411 functions as a channel body, and on/off control is possible. Therefore, it can be expected that a leakage current flowing from the word line 112 to the global bit line 115 during an access operation is more suppressed than when the local bit line LBL is simply formed by a conductive wiring line.

However, in reality, the local bit line 411 cannot be reliably completely switched off, and an expected advantage of reduction in leakage current sometimes also cannot be obtained. In that respect, in the case of the memory cell array 400, similarly to in the case of the memory cell array 100, the select gate 124 is provided between each of the local bit lines 411 and the global bit line 115, hence the leakage current can be more reliably reduced.

Moreover, in a memory cell array of another comparative example, contrary to in the memory cell array 400, a lower end of the bit line control line BCL stops at a position of a lower end of the local bit line 411. In other words, the bit line control line BCL of the memory cell array of this comparative example does not function as a select gate control line. Moreover, instead, the memory cell array of this comparative example has a similar configuration to the select gate control line 731 of the memory cell array 700. In this case, similarly to in case of the memory cell array 700, short circuiting between the select gate control lines adjacent in the Y direction easily occurs, and consequently, there is concern about increase in chip area or lowering of cell occupancy rate. In that respect, in the memory cell array 400, similarly to in the memory cell array 100, the bit line control line 441 disposed between the local bit lines 411 adjacent in the X direction functions as the select gate control line, hence occurrence of short circuiting between the select gate control lines does not happen. Furthermore, since the bit line control line 441 is only extended to a position of the select gate 124 in the Z direction, there is little effect on another structure excluding the bit line control line BCL.

From the above, the memory cell array 400 of the present embodiment makes it possible to provide a semiconductor memory device in which not only similar advantages to those of the memory cell array 100 of the first embodiment are obtained, but also in which the leakage current flowing from the word line to the global bit line is more reduced and an operation margin is more improved compared to in the memory cell array 100, without an accompanying increase in chip area.

Next, other working examples of the memory cell array 1 of the present embodiment will be described.

Figure 18:
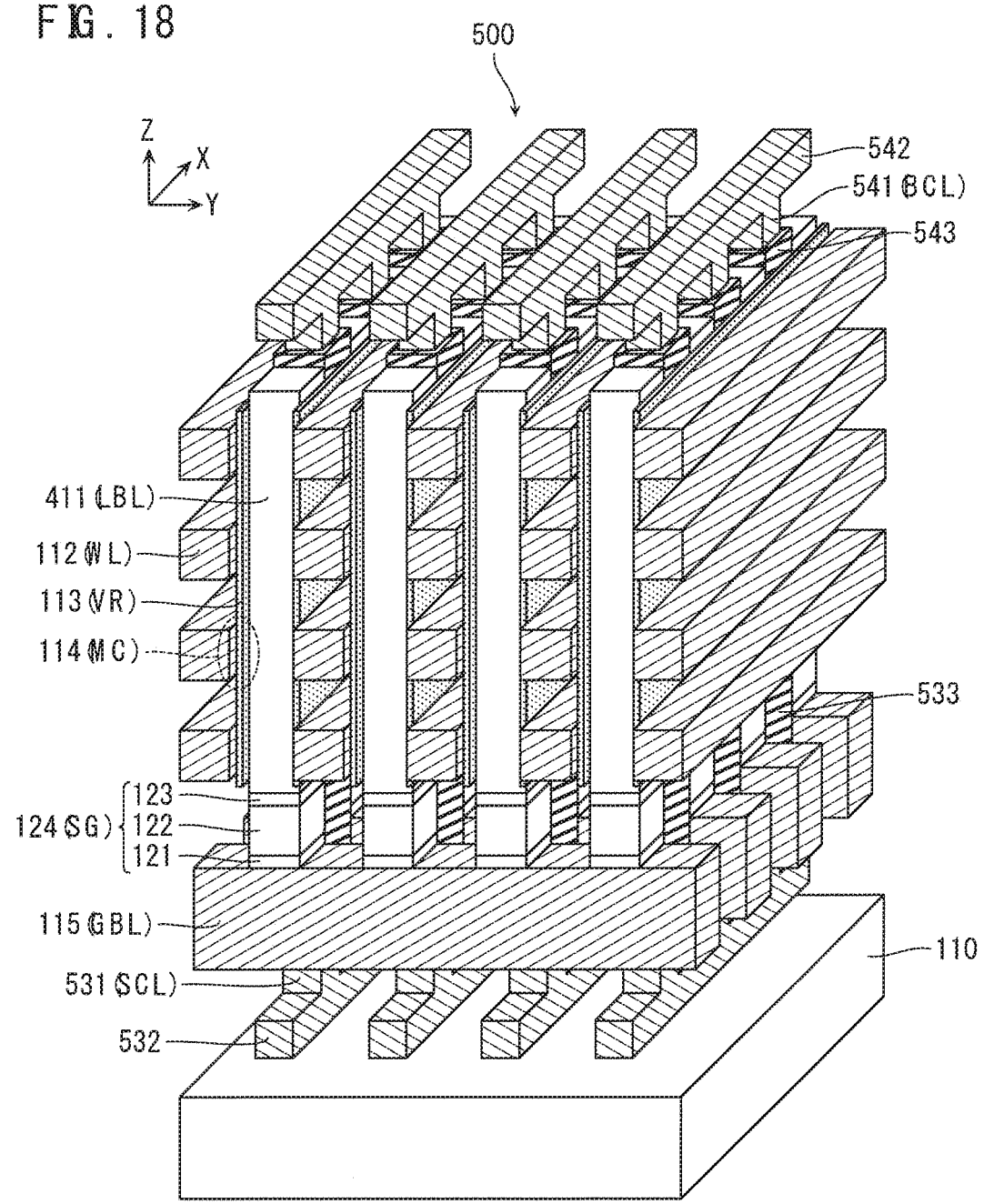
FIG. 18 is a perspective view of the memory cell array of the semiconductor memory device according to the same embodiment.
Figure 19:
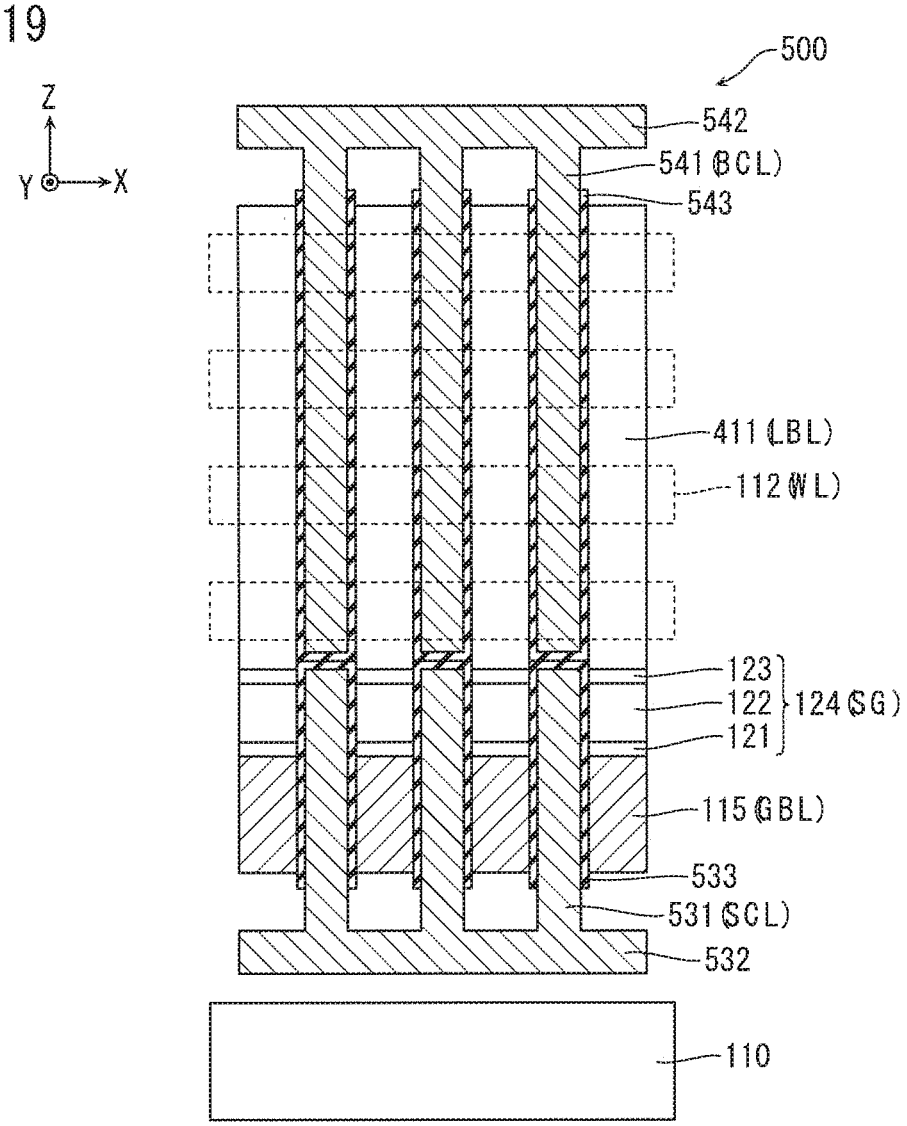
FIG. 19 is a cross-sectional view of the memory cell array of the semiconductor memory device according to the same embodiment.
Figure 20:
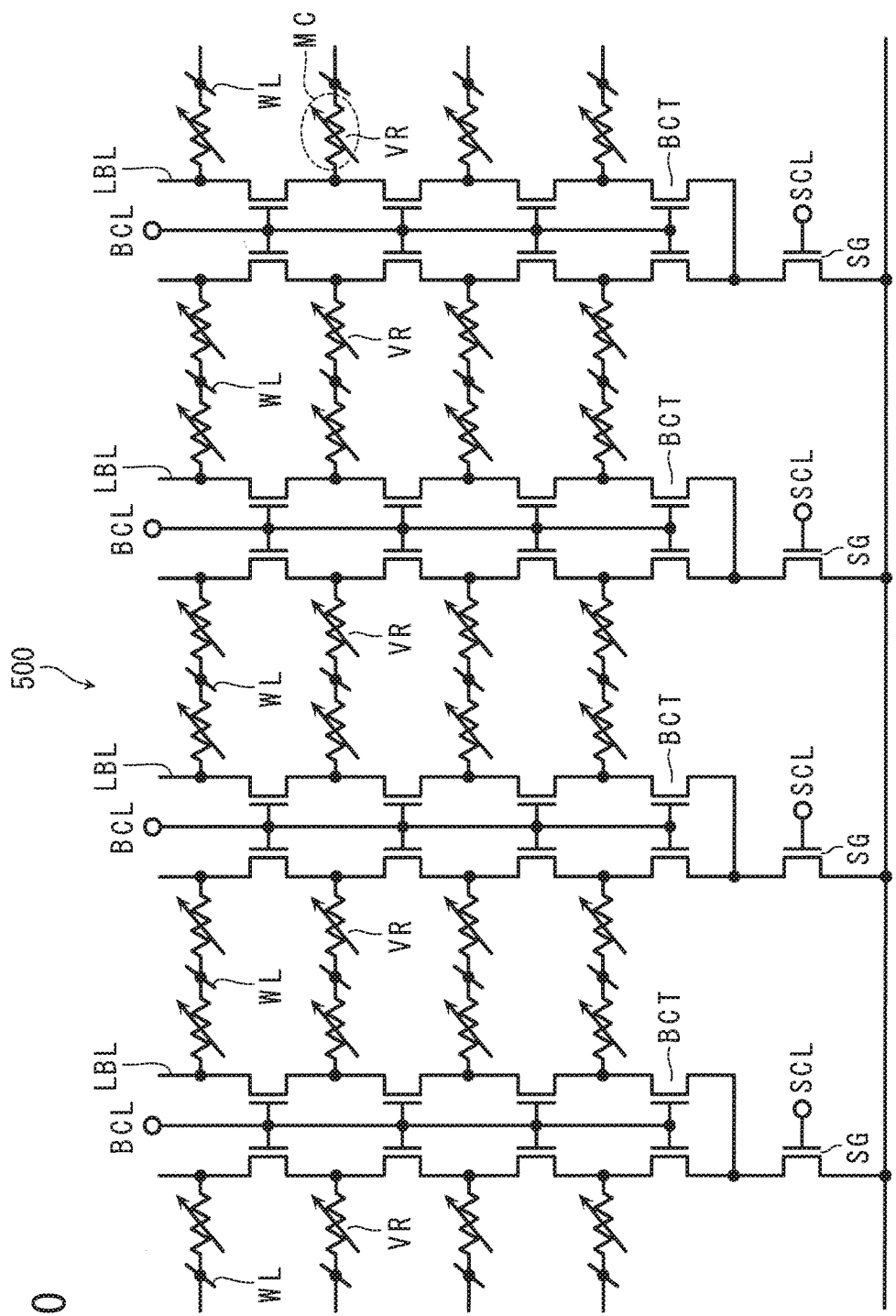
FIG. 20 is a circuit diagram of the memory cell array of the semiconductor memory device according to the same embodiment.
Figure 21:
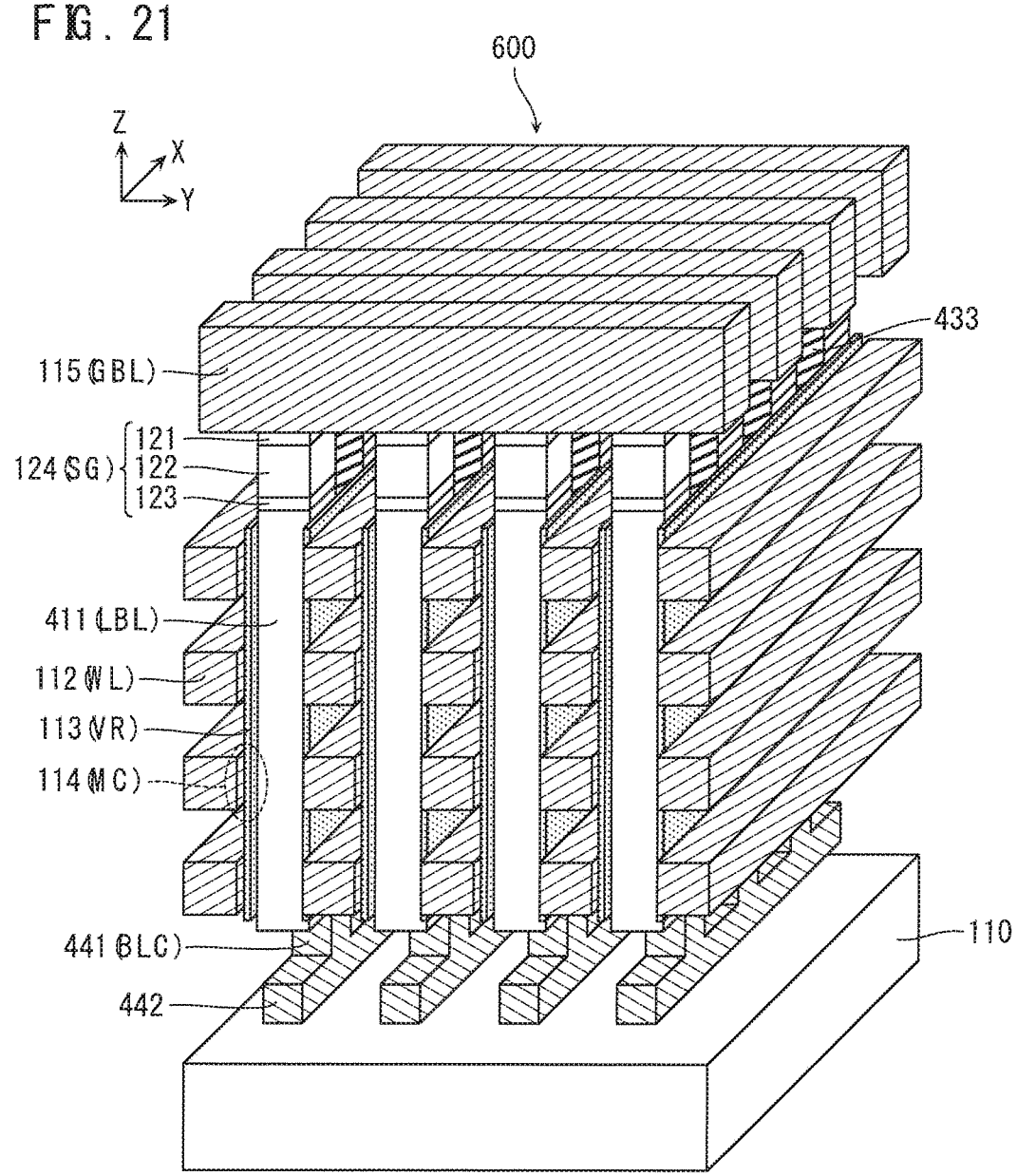
FIG. 21 is a perspective view of the memory cell array of the semiconductor memory device according to the same embodiment.
Figure 22:
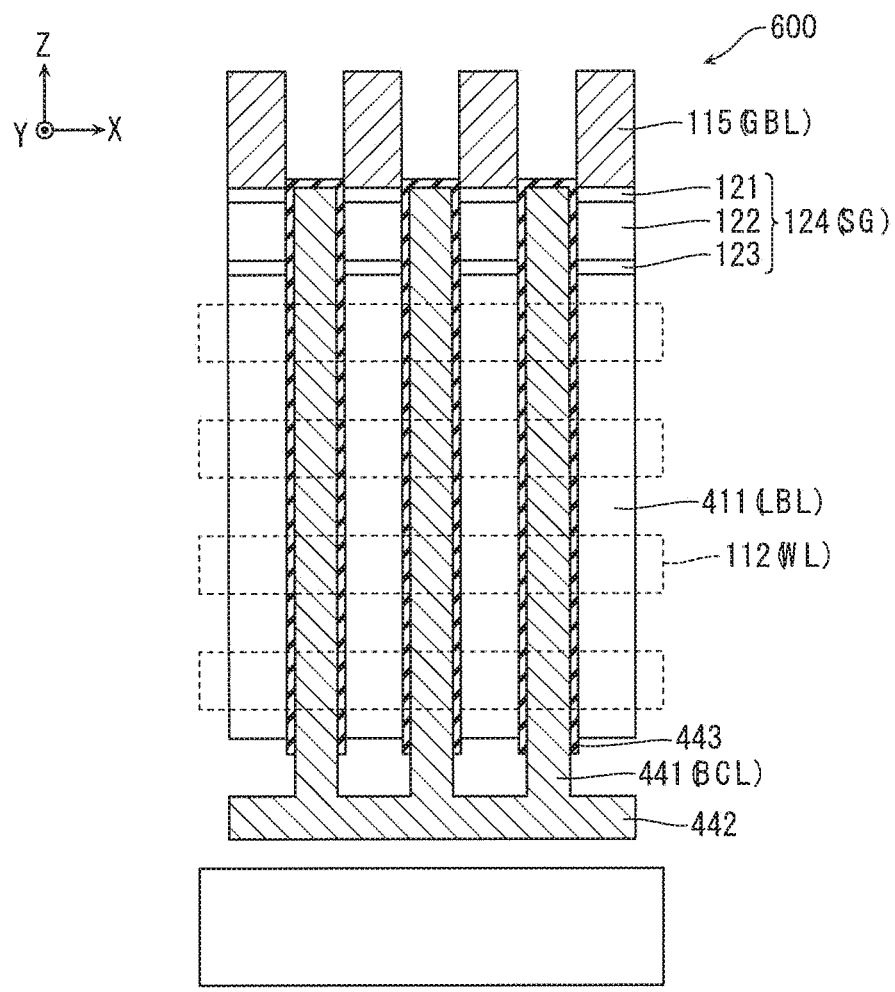
FIG. 22 is a cross-sectional view of the memory cell array of the semiconductor memory device according to the same embodiment.

FIGS. 18 and 21 are perspective views of memory cell arrays 500 and 600 of the semiconductor memory device according to the present embodiment; and FIGS. 19 and 22 are cross-sectional views of the memory cell arrays 500 and 600. In addition, FIG. 20 is a circuit diagram of the memory cell array 500. In FIGS. 18 and 21, for ease of understanding of the structures of the memory cell arrays 500 and 600, part of the configuration such as an insulating film is omitted. FIGS. 19 and 22 are cross-sectional views in the Y-Z directions at a position of the local bit line 411 in the X direction. Note that configurations similar to the configurations shown in FIGS. 3 to 11, of FIGS. 18, 19, 21, and 22 are assigned with the same symbols as in FIGS. 3 to 11, and descriptions of those configurations will be omitted. The memory cell array 500 shown in FIGS. 18 and 19, contrary to the memory cell array 400, includes a select gate control line 531 (SCL) which is independent from a local bit line control line 541 (BCL). Specifically, the select gate control line 531 and the local bit line control line 541 are formed separated at a position of the upper end of the select gate 124 in the Z direction. Moreover, similarly to the select gate control lines 231 of the memory cell array 200, the select gate control lines 531 aligned in the X direction are commonly connected to a select gate control connecting line 532 disposed more downwardly than the global bit line 115, and each of the select gate control lines 531 has its four side surfaces and upper surface covered by an insulating film 533. Moreover, the bit line control lines 541 aligned in the X direction are commonly connected to a bit line control connecting line 542 disposed more upwardly than the uppermost layer word line 112, and each of the bit line control lines 541 has its four side surfaces and bottom surface covered by an insulating film 543.

In the case of the memory cell array 500 having this structure, the bit line control line 541 (BCL) and the select gate control line 531 (SCL) are separated, hence as shown in FIG. 20, the local bit line 411 and the select gate 124 can be individually controlled.

The memory cell array 600 shown in FIGS. 21 and 22 has a structure of the memory cell array 400 configured upside down with respect to the semiconductor substrate 110. In other words, the global bit line 115 is disposed more upwardly than the uppermost layer word line 112, and is disposed further from the semiconductor substrate 110 than the word line 112 is. Moreover, the local bit line 111 and the global bit line 115 are electrically connected via the select gate 124 disposed on an upper end of the local bit line 111. Moreover, the bit line control connecting line 442 is disposed more downwardly than the lowermost layer word line 112, and is disposed closer to the semiconductor substrate 110 than the word line 112 is. Moreover, the bit line control line 441 is connected at its lower end to the bit line control connecting line 442.

These memory cell arrays 500 and 600 are also able to achieve similar advantages to those of the memory cell array 400.

OTHERS

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising
a first wiring line extending in a first direction;
a second wiring line extending in a second direction, the second direction intersecting the first direction;
a variable resistance film disposed at an intersection of the first wiring line and the second wiring line;
a channel body disposed at a first end of the first wiring line;
a third wiring line electrically connected to the first wiring line via the channel body;
a gate wiring line extending in the first direction and facing the channel body from the second direction; and
a plurality of the first wiring lines aligned in the second direction,
wherein the gate wiring line is disposed between the plurality of first wiring lines in the second direction.

2. The semiconductor memory device according to claim 1, comprising
a plurality of the second wiring lines aligned in a third direction, the third direction intersecting the first direction and the second direction,
wherein the gate wiring line is disposed between the plurality of second wiring lines in the third direction.

3. The semiconductor memory device according to claim 2, wherein
a plurality of the gate wiring lines are arranged in a matrix in the second direction and the third direction,
the plurality of gate wiring lines are electrically commonly connected every column, and
a column direction of the commonly connected gate wiring lines intersects an extension direction of the third wiring line.

4. The semiconductor memory device according to claim 1, wherein
a plurality of the gate wiring lines are arranged in the second direction, and
the semiconductor memory device further comprises a fourth wiring line electrically commonly connected to one ends of the plurality of gate wiring lines.

5. The semiconductor memory device according to claim 4, wherein
the fourth wiring line extends in the second direction and intersects the third wiring line.

6. A semiconductor memory device, comprising:
a first wiring line extending in a first direction;
a second wiring line extending in a second direction, the second direction intersecting the first direction;
a variable resistance film disposed at an intersection of the first wiring line and the second wiring line;
a channel body disposed at a first end of the first wiring line;
a third wiring line electrically connected to the first wiring line via the channel body; and
a gate wiring line extending in the first direction and facing the channel body from the second direction; wherein
the gate wiring line is a columnar body extending from a position of a second end different from the first end of the first wiring line to a position of the channel body, in the first direction.

7. The semiconductor memory device according to claim 6, further comprising
an insulating film covering a side surface of the gate wiring line.

8. The semiconductor memory device according to claim 6, wherein
the first direction is a direction intersecting an upper surface of a semiconductor substrate.

9. The semiconductor memory device according to claim 8, wherein
the third wiring line is disposed further from the semiconductor substrate than the second wiring line is, in the first direction.

10. A semiconductor memory device, comprising:
a semiconductor substrate;
a first wiring line including a first channel body that extends in a first direction intersecting an upper surface of the semiconductor substrate;
a second wiring line extending in a second direction, the second direction intersecting the first direction;
a variable resistance film disposed at an intersection of the first wiring line and the second wiring line;
a second channel body disposed at a first end of the first wiring line;
a third wiring line electrically connected to the first wiring line via the second channel body;

a first gate wiring line extending in the first direction and facing the first channel body from the second direction; and a second gate wiring line extending in the first direction and facing the second channel body from the second direction.

11. The semiconductor memory device according to claim 10, comprising a plurality of the first wiring lines aligned in the second direction, wherein the second gate wiring line is disposed between the plurality of first wiring lines in the second direction.

12. The semiconductor memory device according to claim 11, comprising a plurality of the second wiring lines aligned in a third direction, the third direction intersecting the first direction and the second direction, wherein the second gate wiring line is disposed between the plurality of second wiring lines in the third direction.

13. The semiconductor memory device according to claim 11, wherein a plurality of the second gate wiring lines are arranged in a matrix in the second direction and a third direction, the third direction intersecting the first direction and the second direction, the plurality of second gate wiring lines are electrically commonly connected every column, and a column direction of the commonly connected second gate wiring lines intersects an extension direction of the third wiring line.

14. The semiconductor memory device according to claim 10, wherein a plurality of the second gate wiring lines are arranged in the second direction, and the semiconductor memory device further comprises a fourth wiring line electrically commonly connected to one ends of the plurality of second gate wiring lines.

15. The semiconductor memory device according to claim 14, wherein the fourth wiring line extends in the second direction and intersects the third wiring line.

16. The semiconductor memory device according to claim 14, wherein the fourth wiring line is disposed closer to the semiconductor substrate than the second wiring line is, in the first direction.

17. The semiconductor memory device according to claim 10, wherein the second gate wiring line is integrated with the first gate wiring line.

18. The semiconductor memory device according to claim 10, wherein the second gate wiring line is separated from the first gate wiring line.

19. The semiconductor memory device according to claim 10, further comprising an insulating film covering a side surface of the second gate wiring line.

* * * * *